US007506443B2

(12) United States Patent
Bowling et al.

(10) Patent No.: US 7,506,443 B2
(45) Date of Patent: Mar. 24, 2009

(54) BEVELED CHARGE STRUCTURE

(75) Inventors: Bruce A. Bowling, Beavercreek, OH (US); Dexter N. Douglass, Enon, OH (US)

(73) Assignee: Eastman Kodak Company, Rochester, NY (US)

( * ) Notice: Subject to any disclaimer, the term of this patent is extended or adjusted under 35 U.S.C. 154(b) by 305 days.

(21) Appl. No.: 11/533,380

(22) Filed: Sep. 20, 2006

(65) Prior Publication Data

US 2007/0013755 A1 Jan. 18, 2007

Related U.S. Application Data

(62) Division of application No. 10/839,464, filed on May 5, 2004, now Pat. No. 7,144,103.

(51) Int. Cl.

| | |
|---|---|
| ***B21D 53/76*** | (2006.01) |
| ***B23P 17/00*** | (2006.01) |
| ***H01L 41/22*** | (2006.01) |
| ***H04R 17/00*** | (2006.01) |
| ***H05K 3/20*** | (2006.01) |
| ***H05K 3/10*** | (2006.01) |

(52) U.S. Cl. ....................... 29/890.1; 29/25.35; 29/831; 29/846

(58) Field of Classification Search ................ 29/890.1, 29/25, 35, 831, 846; 347/74–84, 90
See application file for complete search history.

(56) References Cited

U.S. PATENT DOCUMENTS 4,595,629 A * 6/1986 Mays ......................... 442/364
4,631,550 A * 12/1986 Piatt et al. ...................... 347/80
4,636,808 A * 1/1987 Herron ......................... 347/76
4,667,207 A * 5/1987 Sutera et al. .................. 347/90
4,757,328 A * 7/1988 Braun et al. .................. 347/90
4,839,664 A * 6/1989 Archer et al. ................. 347/90
4,928,113 A * 5/1990 Howell et al. ................. 347/76
4,994,821 A * 2/1991 Fagerquist ................... 347/81
5,512,117 A * 4/1996 Morris ......................... 216/20
6,595,629 B2 * 7/2003 Tachibana et al. ............. 347/77

FOREIGN PATENT DOCUMENTS

EP 0771655 10/1996

* cited by examiner

*Primary Examiner*—David P Bryant
*Assistant Examiner*—David P Angwin
(74) *Attorney, Agent, or Firm*—The Buskop Law Group, P.C.

(57) ABSTRACT

A drop selection assemblage for use in a printhead and method of making includes a drop generator with a jet array for releasing a drop stream along a normal drop path. The drop stream includes print media drops and recycle drops. The assemblage has a charge structure disposed in a spaced apart relationship to the jet array. The charge structure is a substrate with a non-beveled and beveled portion sloped between 3 degrees and 25 degrees relative to the normal drop path. The charge structure has one or more drop charging electrodes on the non-beveled portion to charge recycle drops and one or more short detection electrodes on the beveled portion. A catcher is located adjacent to the charge structure for catching drops that have passed along the charge structure. The print media drops are selected, and the recycle drops are deflected without either contacting the charge structure.

9 Claims, 3 Drawing Sheets

BEVELED CHARGE STRUCTURE

CROSS-REFERENCE TO RELATED APPLICATION

This is a divisional of application Ser. No. 10/839,464 filed May 5, 2004 now U.S. Pat. No. 7,144,103.

FIELD OF THE INVENTION

The present embodiments relate to an apparatus that creates clearance between charged inkjet droplets and adjacent circuitry in an ink jet printing system.

BACKGROUND OF THE INVENTION

In continuous ink jet printing, electrically conductive ink is supplied under pressure to an orifice device, which can be an orifice plate, that distributes the ink to a plurality of orifices, typically arranged in a linear array(s), forming ink jets. The ink discharges from the orifices in jets that break into droplet streams. Individual drops in the droplet streams are selectively charged in the region of the break off from the filaments, and charge drops are deflected from their normal trajectories. The deflected drops may be caught and re-circulated. The undeflected drops are allowed to proceed to a print medium.

Drops are charged by a charge structure having a plurality of drop charging electrodes along one edge, and a corresponding plurality of connecting leads along one surface. The edge of the charge structure having the drop charging electrodes is placed in close proximity to the break off point of the ink jet filaments, and voltage applied to the drop charging electrodes induce charges on the drops as they break off from the filaments. The close proximity of the drop charging electrodes to the ink jet filaments and to the droplet streams makes these drop charging electrodes susceptible to contact with the inkjet filaments and the droplet streams. If ink makes contact with the drop charging electrodes, it can produce an electrical shorting condition between the drop charging electrodes and other components. If voltage is applied to the drop charging electrodes when such a shorting condition exists, damage can occur to the drop charging electrodes and/or to the component to which the drop charging electrodes are shorted to.

To protect these ink jet components, it is desirable to employ short detection means to detect potentially damaging shorting conditions between the drop charging electrodes and other components. One highly effective means for detecting shorting conditions utilizes short detection electrodes placed just below the drop charging electrodes. Ink that would short drop charging electrodes to other components will then make contact with the short detection electrodes where the shorting condition can be readily detected.

The placement of the short detection electrodes just below the drop charging electrodes results in these electrodes being more closely aligned with the droplet streams than are the drop charging electrodes. As a result, on occasion the droplet streams can make transient, incidental contact with the short detection electrodes when a shorting condition to the drop charging electrodes doesn't exist. Detection of the contact to the short detection electrodes by the associated short detection circuitry results in the initiation of a short recovery process, spotting print until the short recovery process is completed. Placement of the short detection electrodes just below the drop charging electrodes, while desirable for readily detecting potentially damaging shorting conditions, has therefore been seen to produce false readings that unnecessarily stop printing.

Inkjet heads require an extremely close alignment between an array of droplets and a series of drop charging electrodes. These electrodes are mounted to plates with circuitry known as a short detection circuit under each electrode to sense for fluid that could come in contact with these high voltage devices. If fluid touches this circuit, power is shut off to these electrodes to avoid damaging the drop charging electrodes or the orifice plate. The close proximity of the short detection circuit is necessary, but on occasion, the short detection electrodes interferes with the droplets of ink causing a false reading that stops printing.

Sutera U.S. Pat. No. 4,667,207 relates to a drop-catching structure for use in a liquid jet printing apparatus. The Sutera reference does not teach electrodes on the beveled face. Other references in the art related to charge plate fabrications are exampled in Morris U.S. Pat. No. 5,512,117 and Howell U.S. Pat. No. 4,928,113. References in the art related to the short detect electrode below charging are exampled in EP Patent Number EP0771655 (in particular, FIG. 3) and Fagerquist U.S. Pat. No. 4,994,821. The prior art listed herein is hereby incorporated by reference.

A need has existed for moving the short detection circuit away from the drop stream.

These embodiments described allow the movement of the short detection circuit away from the drop stream.

SUMMARY OF THE INVENTION

A drop selection assemblage for use in a printhead includes a drop generator with a jet array, a charge structure and a catcher. The jet array release a drop stream containing print media drops and recycles drops along a normal drop path. The charge structure is located in a spaced apart relationship to the jet array, and includes a substrate with a non-beveled and beveled portion. The beveled portion is sloped at an angle between 3 degrees and 25 degrees relative to the normal drop path. One or more drop charging electrodes are located on the non-beveled portion to charge recycle drops, and one or more short detection electrodes are located on the beveled portion. The catcher disposed adjacent the charge structure for snares drops from the drop generator that have passed along the first side of the charge structure. The print media drops are selected without contacting the charge structure and the recycle drops are deflected without contacting the charge structure.

Methods for improved drop selection printhead include forming a drop selection assemblage, wherein a portion of the charge structure is beveled so the slope is 3 degrees and 25 degrees from the normal drop path from the drop generator. One or more drop charging electrodes are formed on the non-beveled side of the charge structure to charge recycle drops, and one or more short detection electrodes are located on the beveled portion. The charge structure is positioned close to the normal drop path.

A method for making an improved charge structure for a printhead entails forming a substrate with a non-beveled face and a beveled portion. The beveled portion is sloped between 3 degrees and 25 degrees from the non-beveled face. Simultaneously, one or more drop charging electrodes are formed on the non-beveled face, and one or more short detection electrodes are formed on the beveled portion.

BRIEF DESCRIPTION OF THE DRAWINGS

In the detailed description of the preferred embodiments presented below, reference is made to the accompanying drawings, in which.

The present embodiments are detailed below with reference to the listed Figures.

DETAILED DESCRIPTION OF THE INVENTION

Before explaining the present embodiments in detail, it is to be understood that the embodiments are not limited to the particular descriptions and that it can be practiced or carried out in various ways.

The assemblage and associated methods take advantage of a beveled edge on a charge structure in order to restrict incidental contact of ink on at least one short detection electrode.

The embodied methods relate to use of the improved assemblage that enables the assemblage to be moved closer to the jet array in order to produce a higher quality image. The improvements also enables better operating latitude with inks because the drop selection efficiency of the charge structure is improved and more effectively causes the trajectories for drops for print media and recycle drops to diverge more rapidly.

The assemblage and associated methods provides a more robust printhead when used with a printhead. The flatness of the non-beveled portion of the charge structure is maintained and results in more uniform drop selection down the length of a jet array. The printhead is usable in an ink jet print station, such as a Kodak Versamark DT92 print station available from Kodak Versamark of Dayton, Ohio.

Figure 1:
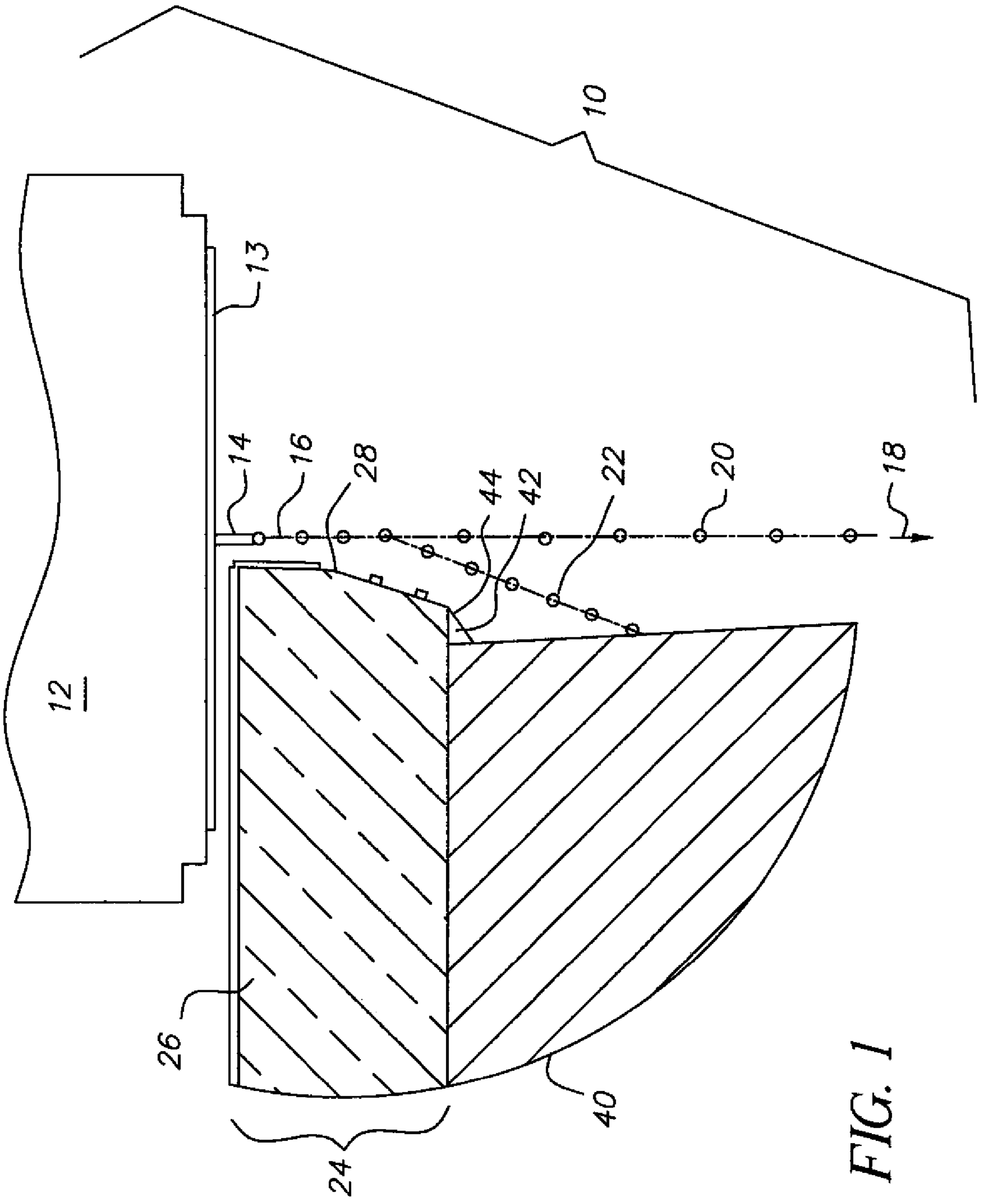
FIG. 1 depicts a side view of an embodiment of the drop selection assemblage.
Figure 2:
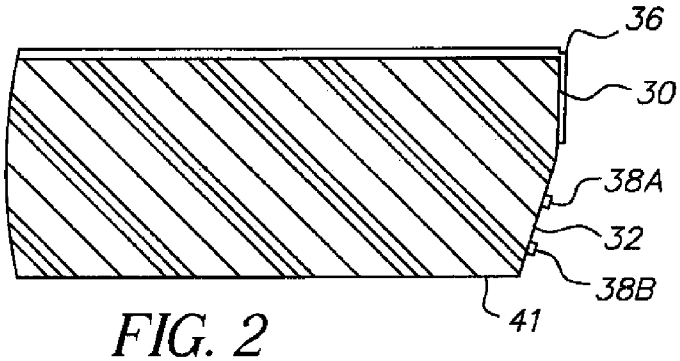
FIG. 2 depicts a detailed view of a portion of FIG. 1.

With reference to the figures, FIG. 1 and FIG. 2 depict a side view and a detailed view, respectively, of an embodiment of the drop selection assemblage 10 for use in a printhead.

The drop selection assemblage 10 includes a drop generator 12 with an orifice device 13 or plate forming a jet array 14. The drop generator releases a drop stream 16 along a normal drop path 18. The drop stream 16, typically, has print media drops 20 and recycle drops 22.

The drop selection assemblage 10 has a charge structure, which can be a charge plate 24 disposed in a spaced apart relationship to the jet array 14. The charge structure 24 has a substrate 26 with a first side 28. The substrate is preferably ceramic, but other materials such as a glass and composites or other materials that are compatible with the ink of the printhead, but those materials that are preferably non porous, and have a low coefficient of thermal expansion can be used. Examples of usable materials are glass, polymer, metal, alloys thereof, laminates thereof, and combinations thereof. The substrate 26 has a non-beveled portion 30 and a beveled portion 32, as depicted in both FIG. 1 and FIG. 2. The beveled portion 32 is a surface sloped at an angle ranging between 3 degrees and 25 degrees relative to the normal drop path. The preferred angle of the sloped surface is 20 degrees.

Continuing with FIG. 1 and FIG. 2, one or more drop charging electrodes 36 are located on the non-beveled portion 30 of the charge structure 24. The drop charging electrodes 36 charge the recycle drops. One or more short detection electrodes 38*a* and 38*b* are located on the beveled portion 32. The drop charging electrodes 36 and short detection electrodes 38 can be formed with the same structure.

The assemblage 10 includes a catcher 40 located adjacent the charge structure 24. The catcher 40 is used to "catch" drops from the drop generator 12 that have passed along the first side 28 of the charge structure 24. The print media drops 20 are selected without contacting the charge structure 24. The recycle drops 22 are deflected without contacting the charge structure 24.

In an alternative embodiment, the charge structure 24 can include a charge structure bottom 41, as depicted in FIG. 1. A sloped epoxy bridge 42 can be created between the charge structure bottom and the catcher or catcher face. The sloped epoxy bridge 42 has a surface that slopes from the drop path to the print media. In a preferred embodiment, the slope 44 ranges between 40 degrees and 80 degrees relative to the drop path. A preferred slope of can be 45 degrees.

Figure 3:
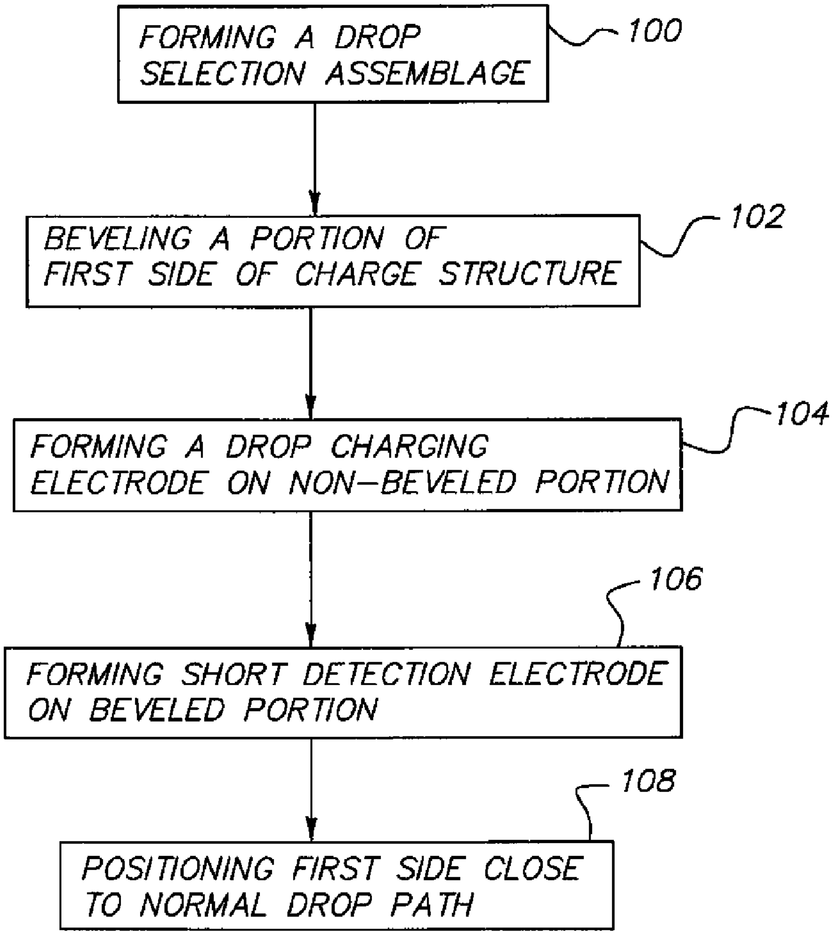
FIG. 3 is a schematic for an embodied method of using an improved drop selection assemblage.

FIG. 3 depicts an embodied method for improved drop selection printhead using a drop selection assemblage (Step 100).

The method begins by beveling a portion of the first side of the charge structure substrate to a slope ranging between 3 degrees and 25 degrees from the normal drop path from the drop generator (Step 102). Beveling the portion of the first side of the charge structure forms a beveled portion. Beveling the charge structure can be performed by grinding, laser cutting, machining and other similar procedures.

One or more drop charging electrodes are then formed on the non-beveled portion of the charge structure (Step 104). The drop charging electrodes charges recycle drops. One or more short detection electrodes are formed on the beveled portion of the charge structure (Step 106).

Finally, the assembled device is positioned close to the normal drop path (108).

In an alternative embodiment, a step can be undertaken wherein electrodes are first formed on a sacrificial mandrel, and the mandrel is folded over the first side of the charge device. The electrodes are adhered to the first side of the mandrel and then the mandrel is removed.

In another embodiment, the electrodes can simply be adhesively bonded to the substrate with an epoxy or a thermoplastic adhesive.

In still another embodiment, at least two short detection electrodes can be placed on the first side of the substrate and then positioned in a spaced apart relationship so that shorting does not occur. The short detection electrodes are spaced far enough apart that moisture in the air adjacent to the short detection electrodes does not produce a false reading of a shorting condition when ink is not present to bridge the short detection electrodes.

Figure 4:
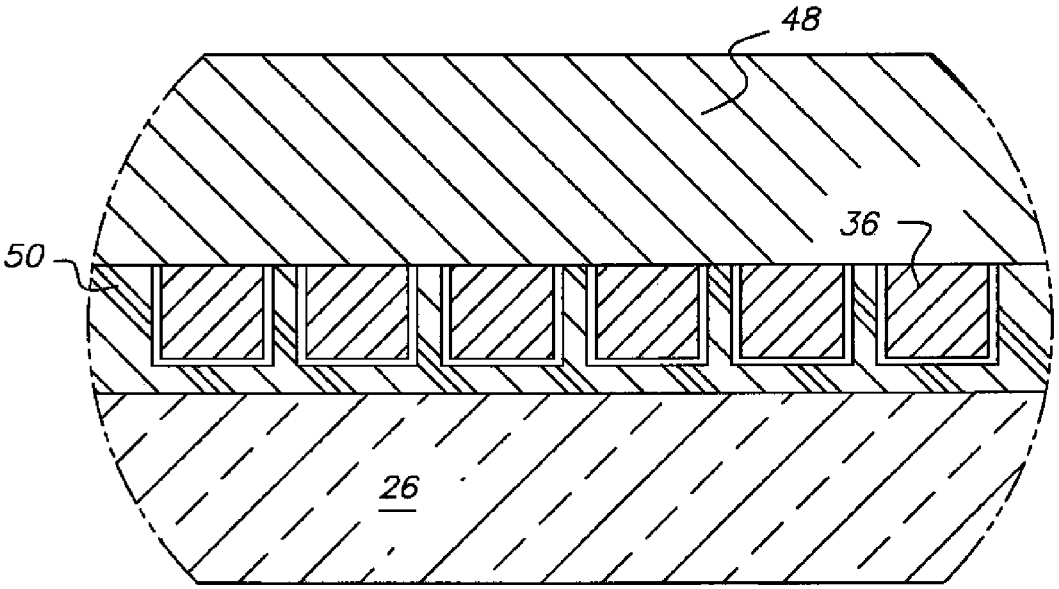
FIG. 4 depicts a cross sectional view of a sacrificial mandrel with electrodes for use on the first side of the charge structure.

FIG. 4 shows an embodiment wherein the drop charging electrodes 36 are first adhered to a sacrificial mandrel. Specifically, FIG. 4 depicts a cross sectional view of the sacrificial mandrel 48 with electrodes for use on the first side of the charge structure. The first side is then orientated towards the beveled portion and the non-beveled portion of the substrate 26 using a polymer adhesive 50, such as an epoxy, a thermoplastic adhesive, or similar adhesive.

Figure 5:
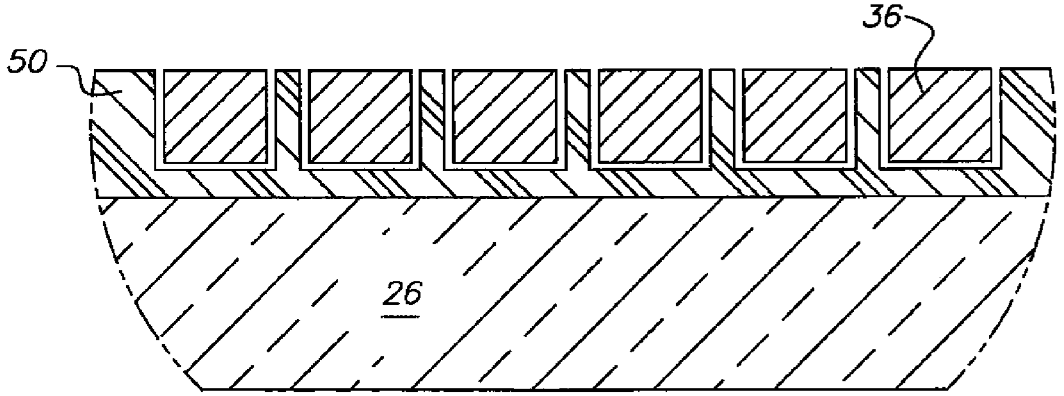
FIG. 5 depicts a cross sectional view of electrodes embedded in a polymer on the charge structure.

FIG. 5 depicts a cross sectional view of drop charging electrodes 36 embedded in a polymer adhesive 50 on the substrate 26 after the mandrel has been removed. The mandrel was bent to secure the attached electrodes to the non-beveled portion. The short detection electrode was secured in a similar manner to the beveled portion. The sacrificial mandrel 48 was removed. The sacrificial mandrel is typically made of a conductive material, such as a metal, a metal alloy, a metal laminate, or a thin metal foil.

Another embodiment includes a method for using an improved drop selection assemblage. A charge structure is made by forming a substrate with a first side by molding, casting or machining. The charge structure has a non-beveled face and a beveled portion. The beveled portion has a slope ranging between 3 degrees and 25 degrees relative to the plane of the non-beveled face. The method continues by forming one or more drop charging electrodes on the non-beveled face to charge recycle drops, and forming one or more short detection electrodes on the beveled portion. The method ends by positioning the non-beveled face close to the normal drop path.

Another aspect of the embodied methods is a technique for constructing an improved charge structure in the drop selection assemblage for a printhead. The method begins by forming a substrate with a first side. The substrate has a non-beveled face and a beveled portion with a slope ranging between 3 degrees and 25 degrees from the non-beveled face. Simultaneously with the first step, one or more drop charging electrodes are formed on the non-beveled face and one or more short detection electrodes are formed on the beveled portion.

In the embodied methods, the method can further comprise the step of forming two or more short detection electrodes on the beveled portion of the substrate or charge structure. The short detection electrodes are formed in a spaced apart relationship that is adequate to prevent false detection of electrode shorting conditions.

The drop charging electrodes and the short detection electrodes are formed by attaching the electrodes to a sacrificial mandrel on the first side of the charge structure. In the embodied methods, the drop charging electrodes and the short detection electrode can be formed by disposing a polymer adhesive on the non-beveled portion and the beveled portion, embedding the drop charging electrodes in polymer adhesive on the non-beveled portion, and embedding the short detection electrode on the beveled portion.

Figure 6:
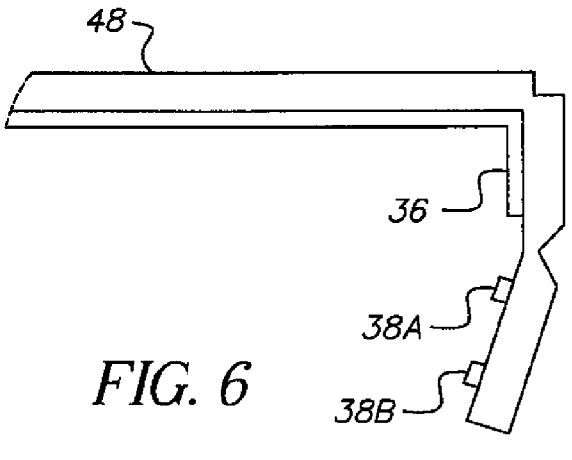
FIG. 6 depicts a side view of the bent mandrel.

FIG. 6 shows the sacrificial mandrel 48 that can be bent over the electrodes 36, 38*a*, and 38*b* that are adhered to the first side of the mandrel.

The embodiments have been described in detail with particular reference to certain preferred embodiments thereof, but it will be understood that variations and modifications can be effected within the scope of the embodiments, especially to those skilled in the art.

PARTS LIST

10. drop selection assemblage
12. drop generator
13. orifice device
14. jet array
16. drop stream
18. normal drop path
20. print media drops
22. recycle drops
24. charge structure
26. substrate
28. first side of the substrate
30. non-beveled portion
32. beveled portion
36. drop charging electrode
38*a*. short detection electrode
38*b*. short detection electrode
40. catcher
41. charge structure bottom
42. sloped epoxy bridge
44. slope of the bridge
48. sacrificial mandrel
50. polymer adhesive
100. step—forming a drop selection assemblage
102. step—beveling a portion of the first side of the charge structure
104. step—forming a drop charging electrode on the non-beveled portion
106. step—forming a short detection electrode on the beveled portion
108. step—positioning the first side close to the normal drop path

What is claimed is:

1. A method for making an improved drop selection assemblage for a printhead comprising a drop generator with an orifice device forming a jet array for releasing a drop stream along a normal drop path, wherein the drop stream consists of print media drops and recycle drops; and a catcher disposed opposite the jet array adapted to catch recycle drops, wherein said method comprises the steps of:

a. making a substrate with a first side comprising a beveled portion and a plane with a non-beveled portion, wherein the beveled portion comprises a slope ranging between 3 degrees and 25 degrees relative to the plane of the non-beveled portion;
b. forming the at least one drop charging electrode on the non-beveled portion;
c. forming the at least one short detection electrode on the slope of the beveled portion.

2. The method of claim 1, wherein the step of making the substrate is by molding, machining, or casting.

3. The method of claim 1, wherein the substrate is a ceramic, a glass, composites, a polymer, a metal, an alloy thereof, laminates thereof, or combinations thereof.

4. The method of claim 1, wherein the step of forming the at least one short detection electrode further comprises forming at least two short detection electrodes on the beveled portion in a spaced apart relationship is adequate to prevent false detection of electrode shorting.

5. The method of claim 1, wherein the step of forming the drop charging electrode and the short detection electrode comprise the step of:

a. attaching each electrode to a sacrificial mandrel on the first side;
b. bending the sacrificial mandrel;
c. orienting the first side toward the beveled portion and the non beveled portion;
d. attaching the electrodes to the first side using a polymer adhesive to secure the electrodes to the first side, and then removing the sacrificial mandrel.

6. The method of claim 5, wherein the sacrificial mandrel is a conductive material.

7. The method of claim 6, wherein the conductive material is a metal, a metal alloy, a metal laminate, or a thin metal foil.

8. The method of claim 5, wherein the polymer adhesive is an epoxy or a thermoplastic adhesive.

9. The method of claim 5, wherein the steps of forming each electrode comprises:

a. disposing a polymer adhesive on the non-beveled portion and the beveled portion; and
b. embedding the drop charging electrode in the polymer adhesive on the non-beveled portion and embedding the short detection electrode on the beveled portion.

* * * * *